(12) United States Patent
Akolkar

(10) Patent No.: US 8,138,084 B2
(45) Date of Patent: Mar. 20, 2012

(54) ELECTROLESS CU PLATING FOR ENHANCED SELF-FORMING BARRIER LAYERS

(75) Inventor: Rohan N. Akolkar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 92 days.

(21) Appl. No.: 12/646,618

(22) Filed: Dec. 23, 2009

(65) Prior Publication Data

US 2011/0147940 A1 Jun. 23, 2011

(51) Int. Cl.
*H01L 21/44* (2006.01)
*H01L 21/4763* (2006.01)

(52) U.S. Cl. ........ 438/653; 438/643; 438/660; 438/687; 438/678; 438/652; 257/E21.585; 257/751

(58) Field of Classification Search .................. 438/652, 438/653, 642, 643, 687, 660; 257/751, E21.585, 257/E21.586
See application file for complete search history.

(56) References Cited

U.S. PATENT DOCUMENTS

| 6,090,710 | A * | 7/2000 | Andricacos et al. | 438/687 |
|---|---|---|---|---|
| 7,153,774 | B2 * | 12/2006 | Hau-Riege et al. | 438/687 |
| 7,338,585 | B2 | 3/2008 | Akolkar et al. | |
| 7,507,659 | B2 * | 3/2009 | Ohtsuka et al. | 438/643 |
| 7,651,943 | B2 * | 1/2010 | Yu et al. | 438/653 |
| 7,928,573 | B2 * | 4/2011 | Onishi et al. | 257/762 |
| 2006/0128148 | A1 * | 6/2006 | Takahashi | 438/661 |
| 2008/0026555 | A1 | 1/2008 | Dubin et al. | |
| 2008/0113508 | A1 | 5/2008 | Akolkar et al. | |
| 2009/0263965 | A1 * | 10/2009 | Gordon et al. | 438/643 |
| 2010/0059893 | A1 * | 3/2010 | Chang et al. | 257/761 |
| 2010/0140802 | A1 * | 6/2010 | Matsumoto et al. | 257/741 |
| 2010/0155951 | A1 * | 6/2010 | Koike et al. | 257/751 |

* cited by examiner

*Primary Examiner* — Nitin Parekh
(74) *Attorney, Agent, or Firm* — Blakely, Sokoloff, Taylor & Zafman LLP

(57) ABSTRACT

Methods and an apparatus are described for an integrated circuit within which an electroless Cu plated layer having an oxygen content is formed on the top of a seed layer comprising Cu and Mn. The integrated circuit is then exposed to a sufficient high temperature to cause the self-formation of a MnSiOx barrier layer.

29 Claims, 5 Drawing Sheets

ELECTROLESS CU PLATING FOR ENHANCED SELF-FORMING BARRIER LAYERS

TECHNICAL FIELD

Embodiments of the present invention relate to semiconductor processing and, more particularly, to methods for enhanced self-forming barrier layers for an integrated circuit.

BACKGROUND

Integrated circuits generally comprise barrier layers at the interface between a conductive layer (typically a metal line or via in a multilayered interconnect structure) and an insulating layer (typically a dielectric layer in such a structure). These barrier layers prevent the diffusion of atoms from the conductive zone to the insulating zone, which can be the origin of integrated circuit malfunctions such as short-circuits between metal lines.

A typical method of forming a barrier layer for an integrated circuit involves forming a via and an overly trench, by a dual damascene process, in a dielectric to an underlying circuit device, such as a transistor or an interconnection. The via and trench are then lined with a barrier layer of a refractory material, such as titanium nitride (TiN), tantalum (Ta), tantalum nitride (TaN) or their combinations. The barrier layer serves to inhibit the diffusion of the interconnection material that will subsequently be introduced in the via and trench into the dielectric. Next, a suitable seed layer is deposited on the wall or walls of the via and trench. Suitable seed materials for the deposition of copper interconnection material include copper (Cu), nickel (Ni), and cobalt (Co). Interconnection material, such as Cu, is then deposited by electroplating or physical deposition in a sufficient amount to fill the via and the trench.

As the integrated circuit dimensions scale down, the trench becomes more and more narrow, thereby causing difficulties to form the barrier layer, the seed layer, and the electroplated Cu layer by using the conventional method described above.

BRIEF DESCRIPTION OF THE DRAWINGS

The present invention is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

Various operations will be described as multiple discrete operations, in turn, in a manner that is most helpful in understanding the present invention. However, the order of the description should be construed to imply that these operations are not necessarily order dependent. In particular, these operations need not be performed in the order of presentation.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. It is to be understood that the various embodiments of the invention, although different, are not necessarily mutually exclusive.

Described herein are an apparatus and methods for enhanced self-forming barrier layers for an integrated circuit. In one embodiment, a seed layer comprising copper (Cu) and manganese (Mn) is formed in a trench located inside a dielectric layer. An electroless Cu plated layer having an oxygen content is then formed over the seed layer. In one embodiment, the electroless Cu plated layer is formed in a sufficient amount to fill up the trench. In another embodiment, an electro Cu plated layer is formed over the electroless Cu plated layer in a sufficient amount to fill up the trench. The filled up trench is then exposed to a high temperature to form a barrier layer. In one embodiment, the barrier layer is a MnSiOx layer. In one embodiment, the high temperature ranges between 250° C. to 400° C.

Figure 1A:
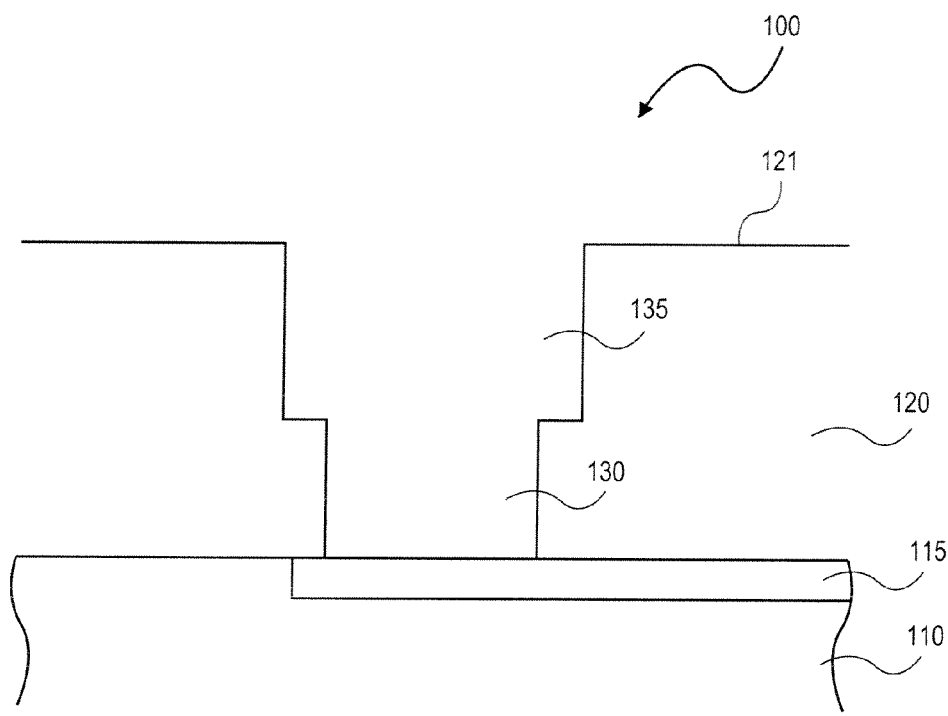
FIGS. 1A to 1F illustrate a method of forming a barrier layer for an integrated circuit according to an embodiment of the present invention.

FIGS. 1A to 1F illustrate a method of forming a barrier layer for an integrated circuit according to an embodiment of the present invention. In FIG. 1A, an interconnect structure 100 is shown having a substrate 110, such as a semiconductor wafer, a conductive layer 115, and a dielectric layer 120 formed over the top of the substrate 110 and the conductive layer 115. In one embodiment, the conductive layer 115 is a metallization layer. A via 130 and a trench 135 are formed in the dielectric layer 120, extending into the dielectric layer 120 from the dielectric layer surface 121 to the top of the conductive layer 115. The via 130 and the trench 135 may be formed by any technique known in the art, including but not limited to, lithography, ion milling, laser ablation, and the like. In one embodiment, a dual damascene process is used to form the trench 135 or the via 130 or both the trench 135 and the via 130.

The dielectric layer 120 may include, but is not limited to, silicon oxide, silicon nitride, carbon doped oxide, fluorinated silicon oxide, boron/phosphorous doped oxide, and the like. In one embodiment, the dielectric layer 120 is an oxygen-depleted porous low-K dielectric layer. In another embodiment, the dielectric layer 120 is a low-K high carbon containing dielectric layer.

Figure 1B:
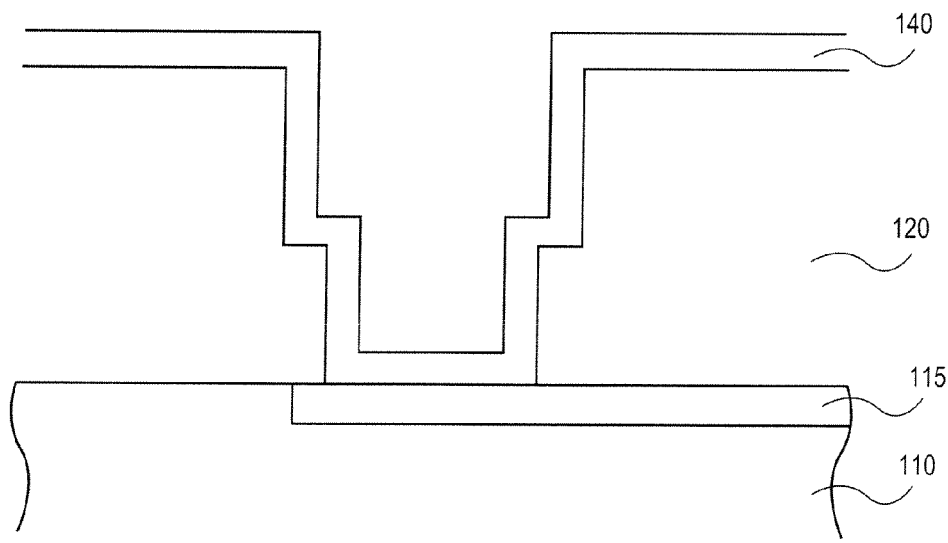

In FIG. 1B, a seed layer 140 is formed along the walls of the trench 135 and the via 130, over the bottom of the via 130, and on top of the dielectric layer surface 121, to substantially and conformally abut or on top of the dielectric layer 120. In one embodiment, the seed layer 140 may include, but is not limited to, copper (Cu) and manganese (Mn). In one embodiment, the Mn in the seed layer 140 is sufficient enough to cause the self-formation of a barrier layer 170 at the interface between the dielectric layer 120 and the seed layer 140 in the subsequent process, for example, by an annealing process. In one embodiment, the content level of Mn in the seed layer 140 is between 2 to 20%. In another embodiment, the content level of Mn in the seed layer 140 is about 8 atomic percent. In one embodiment, the seed layer 140 is formed by a physical vapor deposition (PVD) method. In another embodiment, the seed layer 140 is formed by a co-sputtering process. Alternatively, the seed layer 140 may be implemented by other methods, such as atomic layer deposition (ALD), as would be appreciated by one of ordinary skill in the art having the benefit of this disclosure. In one embodiment, the ratio between the trench opening and the thickness of the seed layer 140 ranges between 3 to 5. In one embodiment, the thickness of the seed layer 140 ranges between 5 nm to 10 nm.

Figure 1C:
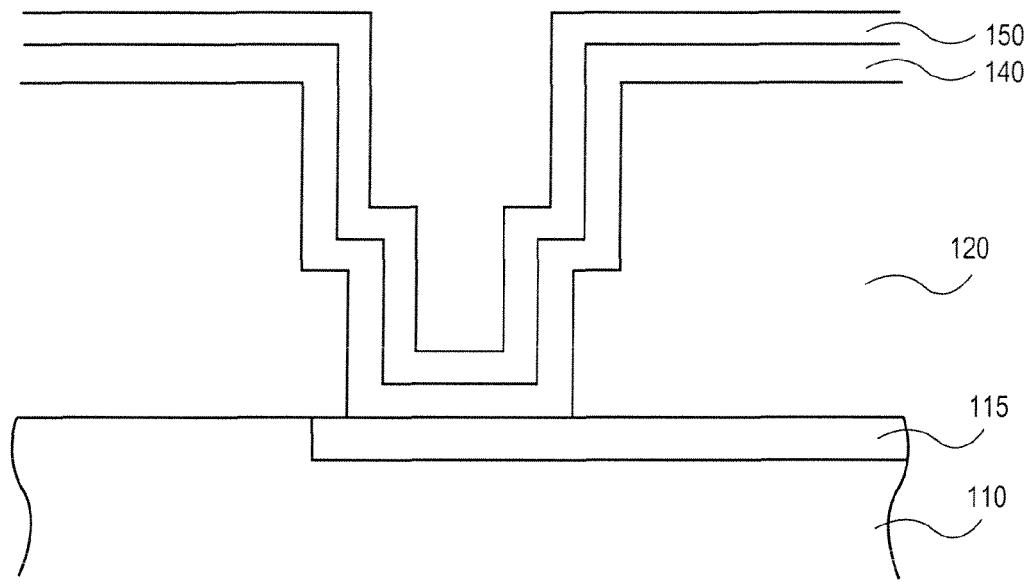

In FIG. 1C, an electroless Cu plated layer 150 having an oxygen content is formed on the top of the seed layer 140 by using an electroless Cu plating process. The electroless Cu plating process may incorporate elevated oxygen content levels in the electroless Cu plated layer 150. In one embodiment, the thickness of the electroless Cu plated layer 150 is between 5 nm to 10 nm. In one embodiment, the content level of oxygen in the electroless Cu plated layer 150 is sufficient enough to promote the self-formation of a barrier layer at the interface between the dielectric layer 120 and the seed layer 140 during the subsequent process, for example, by an annealing process. In one embodiment, the level of the oxygen content in the electroless Cu plated layer 150 is between 1 to 5 atomic percent. In one embodiment, the oxygen in the electroless Cu plated layer 150 is in the form of oxygen atoms.

The technique of electrolessly forming a metal or metal alloy layer is known to those skilled in the art, and may be performed either by immersing the substrate in an electroless plating solution, by semi-immersion, or by spraying the electroless plating solution onto the substrate or target (e.g., the dielectric layer 120). It is to be understood that the composition of an electroless plating solution may vary depending on the desired plating outcome. In one embodiment, the electroless plating solution used to form the electroless Cu plated layer 150 comprises complexed Cu ions, an alkaline media, and a reducing agent. In one embodiment, the electroless plating solution used to form the electroless Cu plated layer 150 includes, but is not limited to, salt $CuSO4.5H_2O$ (0.03-01M), ethylene diamine tetraacetic acid (EDTA) (0.2-0.4M), reductant, e.g., glyoxylic acid, (0.0-0.5M), and additive, e.g., 2.2'-bipyridine (10-50 ppm). In one embodiment, the electroless Cu plating process may be conducted by using the electroless plating solution at the temperature ranging between 50° C. to 65° C. and the pH ranging between pH 11 to pH 12.5 (adjusted with NaOH or KOH). In one embodiment, the agitation used for the electroless Cu plating solution is induced by wafer rotation or flow. Although a few examples of materials that may comprise the electroless plating solution are described here, the solution may comprise other materials that serve to form the Cu layer electrolessly. Alternatively, other known electroless Cu plating solutions may be used, as would be appreciated by one of ordinary skill in the art having the benefit of this disclosure.

Figure 1D:
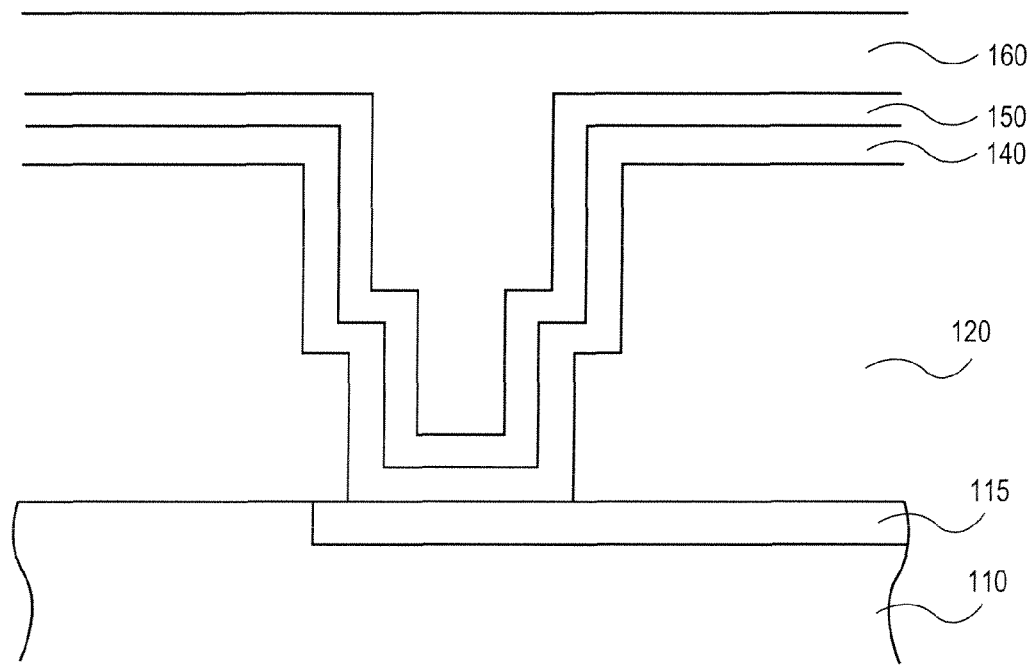

In FIG. 1D, an electro Cu plated layer 160 is formed on the top of the electroless Cu plated layer 150 in a sufficient amount to completely fill the gap of the trench 135 and the via 130. In one embodiment, the electroplating solution used to form the electro Cu plated layer 160 includes salt $CuSO4.5H_2O$ (0.1-0.8M) and acid $H_2SO_4$ used to adjust the pH ranging between pH 1 to pH 3. It is, of course, understood that the electroplating solution may also include additives (e.g., suppressor, anti-suppressor, leveler), or other commercially available additives. In one embodiment, the electroplating solution may be used at a temperature of 20° C. to 30° C. for the electroplating process, and the agitation to the electroplating solution is induced by wafer rotation or flow.

In one embodiment, the electroless Cu plated layer 150 is formed in a sufficient amount to fill the gap of the trench 135 and via 130. In this case, the electroplating process used for forming the electro Cu plated layer 160, as shown in FIG. 1D, may be skipped.

Figure 1E:
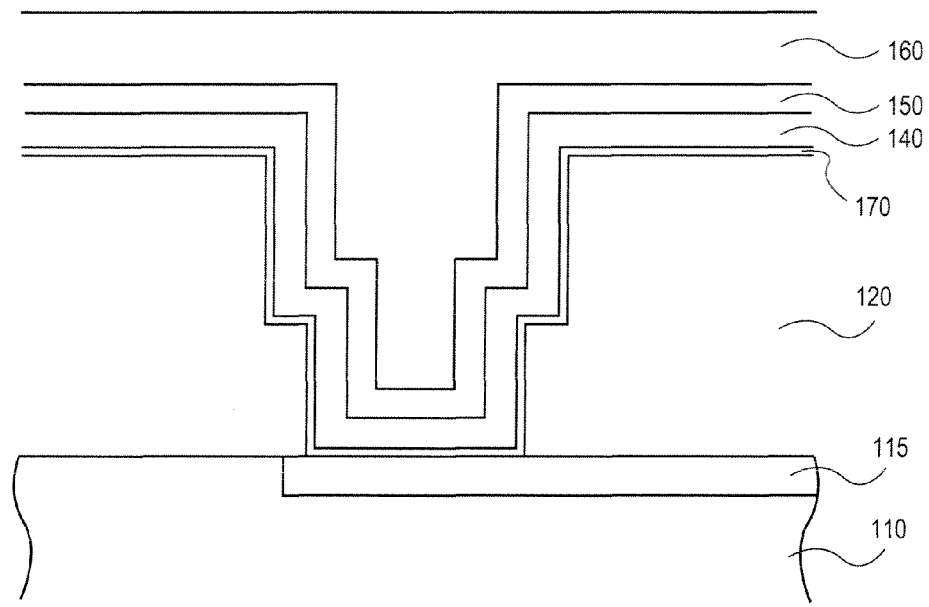

In FIG. 1E, a barrier layer 170 is formed at the interface between the dielectric layer 120 and the seed layer 140 by exposing the interconnect structure 100 to a sufficient high temperature. The high temperature drives the Mn in the seed layer 140 and the oxygen content in the electroless Cu plated layer 150 to the interface between the dielectric layer 120 and the seed layer 140 to promote the formation of the barrier layer 170. In one embodiment, the barrier layer 170 is a self-formed MnSiOx layer due to the chemical reaction among the Mn in the seed layer 140, the $SiO_2$ from the dielectric layer 120, and the oxygen (O) that may be supplied by the damaged dielectric layer 120 or by the oxygen content contained in the electroless Cu plated layer 150.

In one embodiment, the exposed high temperature ranges from 250° C. to 400° C. In one embodiment, the high temperature is achieved by annealing the interconnect structure 100 at a temperature between 200° C. to 400° C., preferably 350° C., for about 10 minutes to 1 hour, in an inert ambient, such as $N_2$. In another embodiment, the high temperature is achieved through the process of forming another dielectric layer on the top of the dielectric layer surface 121 of the interconnect structure 100 after the portions of the seed layer 140, the electroless Cu plated layer 150, and the electroplated Cu layer 160 formed on the top of the dielectric layer surface 121 are removed via a polishing process, as illustrated in FIGS. 2A to 2C.

Figure 1F:
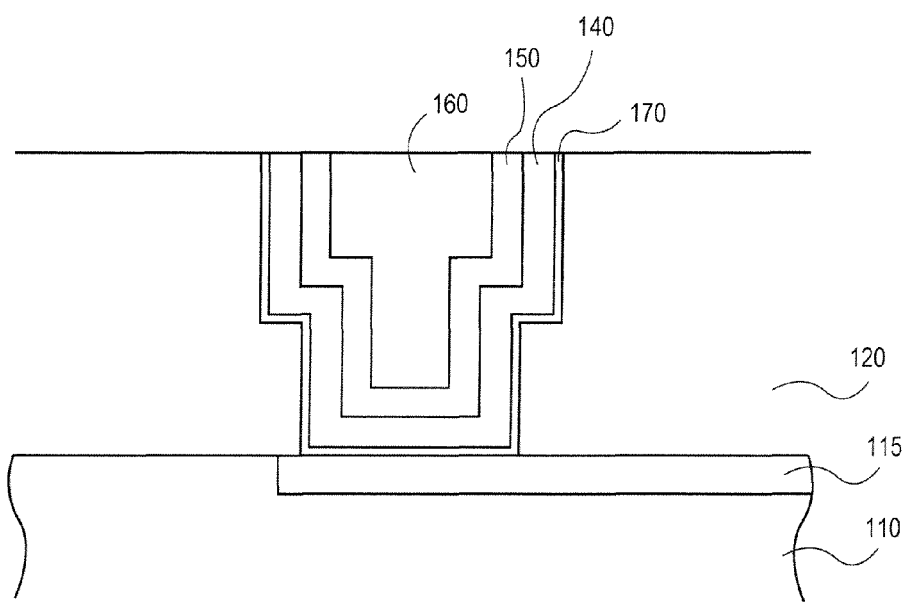

In FIG. 1F, a polishing process is performed to remove the portions of the seed layer 140, the electroless Cu plated layer 150, the electro Cu plated layer 160, and the barrier layer 170 formed on the top of the dielectric layer surface 121. As a result, an interconnect line 160 is formed on the top surface of the interconnect structure 100, and the interconnect line 160 is connected to the conductive layer 115 through the via 130.

Figure 2A:
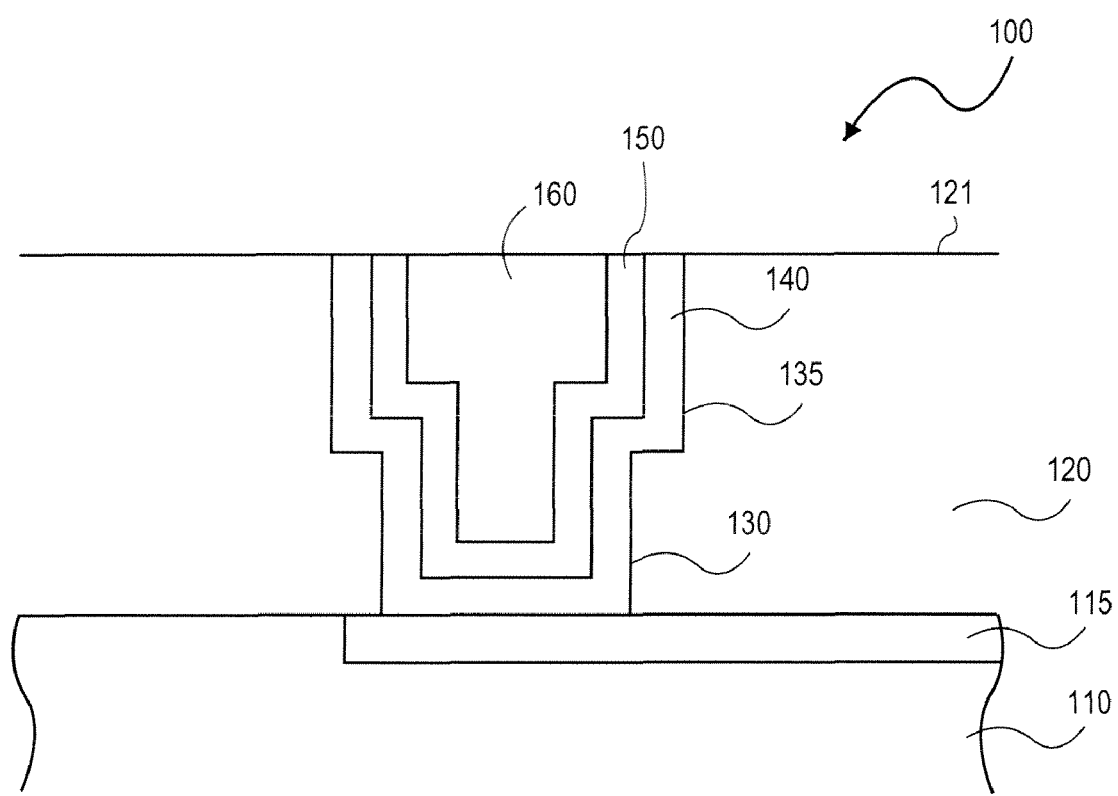
FIGS. 2A to 2B illustrate a method of forming a barrier layer for an integrated circuit according to an embodiment of the present invention.
Figure 2B:
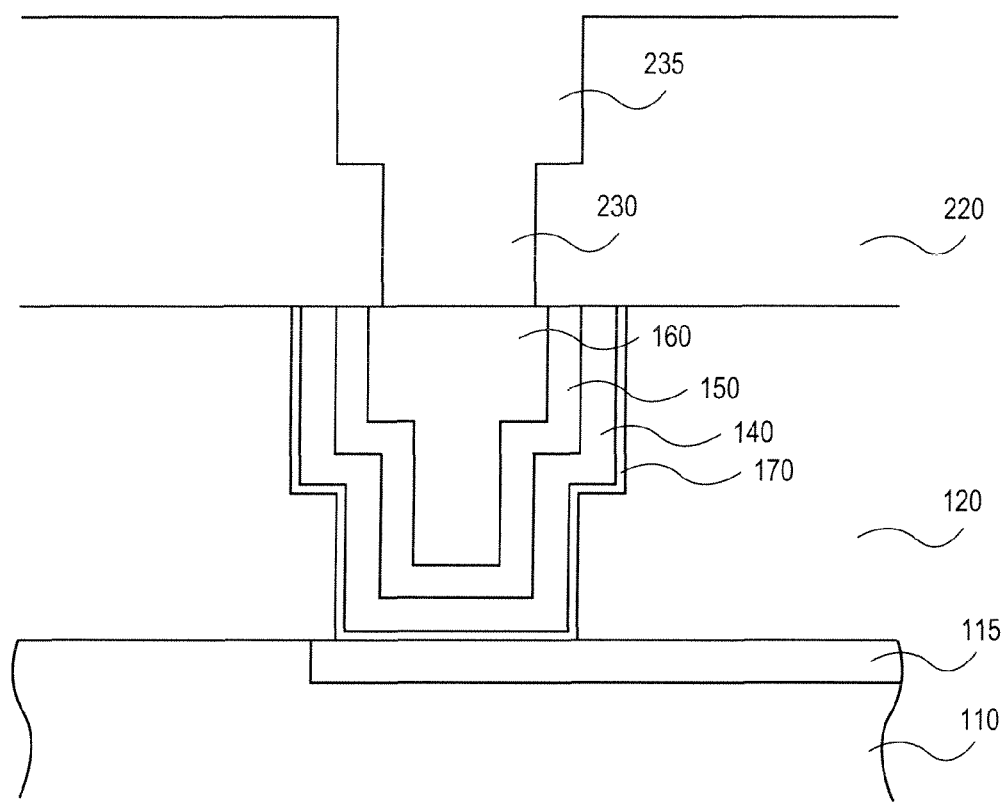

FIGS. 2A to 2B illustrate a method of forming a barrier layer for an integrated circuit according to an embodiment of the present invention. FIG. 2A shows the dielectric layer surface 121 of the interconnect structure 100 shown in FIG. 1D has been polished, after the formation of the seed layer 140, the electroless Cu plated layer 150, and the electro Cu plated layer 160 inside the gap of the trench 135 and the via 130. The polishing process removes the portions of the seed layer 140, the electroless Cu plated layer 150, the electro Cu plated layer 160 formed on the top of the dielectric layer surface 121. Accordingly, an interconnect line 160 is formed and is connected to the conductive layer 115 through the via 130.

In FIG. 2B, a dielectric layer 220 is formed on the top of the dielectric layer surface 121. Subsequently, a trench 235 and a via 230 are formed in the dielectric layer 220, extending into the dielectric layer 220 to reach the top of the interconnect line 160. The via 230 and the trench 235 may be formed by any technique known in the art, including but not limited to, lithography, ion milling, laser ablation, and the like. In one embodiment, a dual damascene process is used to form the trench 235 or the via 230 or both the trench 235 and the via 230. The dielectric layer 220 may include, but is not limited to, silicon oxide, silicon nitride, carbon doped oxide, fluorinated silicon oxide, boron/phosphorous doped oxide, and the like. In one embodiment, the dielectric layer 220 is an oxygen-depleted porous low-K dielectric layer. In another embodiment, the dielectric layer 220 is a low-K high carbon containing dielectric layer.

The deposition of the dielectric layer 220 or the etching of the trench 235 and the via 230, or the combination of the deposition of the dielectric layer 220 and the etching of the trench 235 and the via 230 results in a sufficient high temperature, which yields the self-formation of the barrier layer 170 formed at the interface between the dielectric layer 120 and the seed layer 140. In one embodiment, the high temperature is 350° C. In one embodiment, the barrier layer 170 is a MnSiOx layer.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
providing a dielectric layer having a trench;
forming a seed layer comprising Cu and Mn in the trench;
electroless plating a Cu layer having an oxygen content over the seed layer to fill up the trench, wherein the oxygen content is greater than 1 atomic percent; and
exposing the filled trench to a high temperature, wherein the high temperature is sufficient to form a MnSiOx layer.

2. The method of claim 1, wherein the oxygen content in the electroless Cu plated layer is between 1 to 5 atomic percent.

3. The method of claim 1, wherein the oxygen content in the electroless Cu plated layer is in the form of oxygen atoms.

4. The method of claim 1, wherein the content of Mn in the seed layer is between 2 to 20 atomic percent.

5. The method of claim 4, wherein the content of Mn in the seed layer is 8 atomic percent.

6. The method of claim 1, wherein the high temperature ranges between 250° C. to 400° C.

7. The method of claim 1, wherein exposing the trench to a high temperature comprises:
annealing the electroless Cu plated layer at a temperature between 200° C. to 400° C.

8. The method of claim 1, wherein exposing the trench to a high temperature comprises:
depositing another dielectric layer over the trench at said high temperature.

9. The method of claim 1, wherein the seed layer is formed by a physical vapor deposition (PVD) process.

10. The method of claim 1, wherein the dielectric layer comprises a porous dielectric material.

11. The method of claim 10, wherein the trench has sidewalls, and wherein the seed layer is formed on an oxygen-depleted, high-carbon containing sidewall of the porous dielectric.

12. A method, comprising:
providing a dielectric layer having a trench;
forming a seed layer comprising Cu and Mn in the trench;
electroless-plating a Cu layer having an oxygen content over the seed layer, wherein the oxygen content is greater than 1 atomic percent;
electro-plating a Cu layer over the electroless Cu plated layer to fill up the trench; and
exposing the filled trench to a high temperature, wherein the high temperature is sufficient to form a MnSiOx layer.

13. The method of claim 12, wherein the oxygen content in the electroless Cu plated layer is between 1 to 5 atomic percent.

14. The method of claim 12, wherein the thickness of the electroless Cu plated layer is between 5 to 10 nm.

15. The method of claim 12, wherein the content of Mn in the seed layer is between 2 to 20 atomic percent.

16. The method of claim 12, wherein the high temperature ranges between 250° C. to 400° C.

17. The method of claim 12, wherein exposing the trench to a high temperature comprises:
annealing the electro Cu plated layer at a temperature between 200° C. to 400° C.

18. The method of claim 12, wherein exposing the trench to a high temperature comprises:
depositing another dielectric layer over the trench at said high temperature.

19. The method of claim 12, wherein the dielectric layer comprises a porous dielectric material.

20. The method of claim 19, wherein the trench has sidewalls, and wherein the seed layer is formed on an oxygen-depleted, high-carbon containing sidewall of the porous dielectric.

21. A method, comprising:
providing a dielectric layer having a trench, wherein the dielectric layer comprises a porous dielectric material;
forming a seed layer comprising Cu and Mn in the trench;
electroless plating a Cu layer having an oxygen content greater than 1 atomic percent over the seed layer in the trench;
filling the trench with Cu to form a filled trench; and
exposing the filled trench to a high temperature, wherein the high temperature is sufficient to form a MnSiOx layer.

22. The method of claim 21, wherein the oxygen content in the electroless plated Cu layer is between 1 to 5 atomic percent.

23. The method of claim 21, wherein the content of Mn in the seed layer is between 2 to 20 atomic percent.

24. The method of claim 21, wherein the high temperature ranges between 250° C. to 400° C.

25. The method of claim 21, wherein the exposing the trench to a high temperature comprises:
annealing the filled trench at a temperature between 200° C. to 400° C.

26. The method of claim 21, wherein the exposing the trench to a high temperature comprises:
depositing another dielectric layer over the trench at said high temperature.

27. The method of claim 21, wherein the filling of the trench comprises electroless plating.

28. The method of claim 21, wherein the filling of the trench comprises electroplating.

29. The method of claim 21, wherein the trench has sidewalls, and wherein the seed layer is formed on an oxygen-depleted, high-carbon containing sidewall of the porous dielectric.

* * * * *